(12) United States Patent
Hsu (10) Patent No.: US 10,356,938 B1
(45) Date of Patent: Jul. 16, 2019

(54) CONNECTION DEVICE FOR CONNECTING RAIL TO RACK POST OF SERVER CABINET

(71) Applicant: Kunshan Lemtech Slide Technology Co., Ltd., Kunshan, Jiangsu (CN)

(72) Inventor: Chi Feng Hsu, New Taipei (TW)

(73) Assignee: Kunshan Lemtech Slide Technology Co., Ltd., Kunshan (CN)

( * ) Notice: Subject to any disclaimer, the term of this patent is extended or adjusted under 35 U.S.C. 154(b) by 0 days.

(21) Appl. No.: 16/178,439

(22) Filed: Nov. 1, 2018

(51) Int. Cl.
    *H05K 7/18*     (2006.01)
    *H05K 7/14*     (2006.01)
    *H05K 5/02*     (2006.01)

(52) U.S. Cl.
    CPC .......... *H05K 7/183* (2013.01); *H05K 5/0204* (2013.01); *H05K 5/0208* (2013.01); *H05K 7/1487* (2013.01); *H05K 7/1489* (2013.01)

(58) Field of Classification Search
    CPC .... H05K 7/183; H05K 7/1487; H05K 5/0208; H05K 7/1489; H05K 5/0204; H05K 7/1488; H05K 7/1421; A47B 88/43; A47B 88/407; A47B 88/483; A47B 96/07; A47B 88/423; A47B 57/485; A47B 57/545; A47B 96/06; A47B 96/067; A47B 2088/4278; A47B 96/061
    USPC ............ 312/265.1, 265.4, 333, 334.4, 334.5, 312/334.1, 319.1, 223.1, 223.2; 248/219.1, 220.22, 220.31, 222.11, 248/220.21, 220.41, 224.8; 211/26, 183, 211/190, 191, 192
See application file for complete search history.

(56) References Cited

U.S. PATENT DOCUMENTS

| | | | | |
|---|---|---|---|---|
| 7,703,734 B2* | 4/2010 | Chen | ...................... | A47B 88/43 108/108 |
| 8,366,217 B1* | 2/2013 | Chen | ...................... | A47B 88/43 312/333 |
| 9,480,183 B2* | 10/2016 | Chen | .................... | H05K 7/1489 |
| 9,532,483 B1* | 12/2016 | Chang | ...................... | F16B 2/12 |
| 9,681,574 B1* | 6/2017 | Chen | .................... | H05K 7/1489 |
| 2008/0203251 A1* | 8/2008 | Chen | ...................... | G06F 1/183 248/200 |
| 2011/0192946 A1* | 8/2011 | Yu | ........................ | H05K 7/1489 248/222.11 |
| 2012/0145850 A1* | 6/2012 | Yu | ........................ | H05K 7/1489 248/220.22 |
| 2012/0193489 A1* | 8/2012 | Yu | ........................ | H05K 7/1489 248/201 |
| 2014/0070064 A1* | 3/2014 | Chen | ...................... | A47B 88/43 248/221.11 |

(Continued)

*Primary Examiner* — Hiwot E Tefera
(74) *Attorney, Agent, or Firm* — Alan D. Kamrath; Mayer & Williams PC (57) ABSTRACT

A connection device for connecting a rail to a rack post, includes a rail and a slidable unit. The slidable unit includes a first member and a second member, and three rivets connected the slidable unit to the rail. The first member includes multiple slots, and the second member includes multiple snapping holes. The first member includes a bent portion which has guide pillars to be inserted into through holes of the bracket of the rail. The slidable unit is slidable along the slots and the snapping holes relative to the rivets. A tongue extends from one inner end of each snapping hole so as to contact the rivet to lock the slidable unit relative to the rail.

4 Claims, 8 Drawing Sheets

(56) References Cited

U.S. PATENT DOCUMENTS

| | | | |
|---|---|---|---|
| 2015/0335156 A1* | 11/2015 | Chen .................... | A47B 96/07 |
| | | | 248/219.1 |
| 2016/0324317 A1* | 11/2016 | Chen .................... | A47B 88/43 |
| 2017/0164507 A1* | 6/2017 | Liao .................... | H05K 7/183 |
| 2018/0014640 A1* | 1/2018 | Chen .................... | A47B 57/34 |

* cited by examiner

CONNECTION DEVICE FOR CONNECTING RAIL TO RACK POST OF SERVER CABINET

BACKGROUND OF THE INVENTION

1. Fields of the Invention

The present invention relates to a connection device for connecting a rail to a rack post of a server cabinet, and more particularly, to a connection device that uses a slidable unit to quickly secure and remove a rail relative to a rack post of a server cabinet.

2. Descriptions of Related Art

A conventional server cabinet known to the applicant is designed to organize servers in an efficient way so as to easily manage and maintain these servers. The conventional server cabinet usually includes multiple racks and each rack is connected with multiple rails to position the servers, and the servers are installed to the rails and can be slid and shifted easily. There are three different shapes of holes provided in the rack posts so as to connect the rails to the racks properly. One rectangular hole, one round hole and one threaded hole are designed as a set of holes in the rack post that the rail is to be connected. The assemblers match the rectangular holes, the round holes and the threaded holes of the rack post with the guide pillars on the rail to position the rails to the rack post.

In order to ensure that the connection between the rack post and the rails is secured, bolts and/or snapping plates are used to fix the rails to the rack post. The size of the rails has to be matched with the size of the rack post, therefore, when matching the guide pillars on the rails with the holes of the rack post, each of the guide pillars is cooperated with a spring which is compressed when the rails are fixed to the rack post, and generates a force to prevent the guide pillars from separating from the holes.

However, the springs gradually loose compression after a long period of time. Besides, the installation includes multiple steps and this takes too much time.

The present invention is intended to provide a connection device for quickly connecting a rail to a rack of a server cabinet so as to eliminate the drawbacks mentioned above.

SUMMARY OF THE INVENTION

The present invention relates to a connection device for connecting a rail to a rack post, and comprises a rail having an opening, a first positioning hole, a second positioning hole and a third positioning hole defined therethrough. A bracket is bent from one end of the rail and has multiple through holes. A slidable unit is slidably connected to one side of the rail and includes a first member and a second member. The first member has a first slot, a second slot, a third slot and a bore defined therethrough. Two tubular members extend from one side of the first member. Multiple guide pillars extend from a bent portion on one end of the first member and are removably inserted into the through holes of the bracket of the rail.

The second member has two apertures defined in the first end thereof, a pressing portion, two snapping holes and two protrusions. The two protrusions protrude from one side of the second member and located close to the second end of the second member. A first rivet extends through a notch located between the two apertures of the second member, the first slot of the first member, and is connected to the first positioning hole of the rail. A second rivet extends through one of the snapping holes of the second member, the second slot of the first member, and is connected to the second positioning hole of the rail. A third rivet extends through the other one of the snapping holes of the second member, the third slot of the first member, and is connected to the third positioning hole of the rail. The two tubular members of the first member are engaged with the two apertures of the second member. The second end of the second member is able to be flexibly lifted away from the rail. The slidable unit is slidable along the notch, the snapping holes, the first, second and third slots relative to the first, second and third rivets.

The present invention will become more obvious from the following description when taken in connection with the accompanying drawings which show, for purposes of illustration only, a preferred embodiment in accordance with the present invention.

DETAILED DESCRIPTION OF THE PREFERRED EMBODIMENT

Referring to FIGS. 1 to 6, the connection device 1 of the present invention comprises a rail 10 and a slidable unit 2. The rail 10 has an opening 100, a first positioning hole 101, a second positioning hole 102 and a third positioning hole 103 defined therethrough. The opening 100 is an oval opening. A bracket 104 is bent from one end of the rail 10 and has multiple through holes 105.

Figure 1:
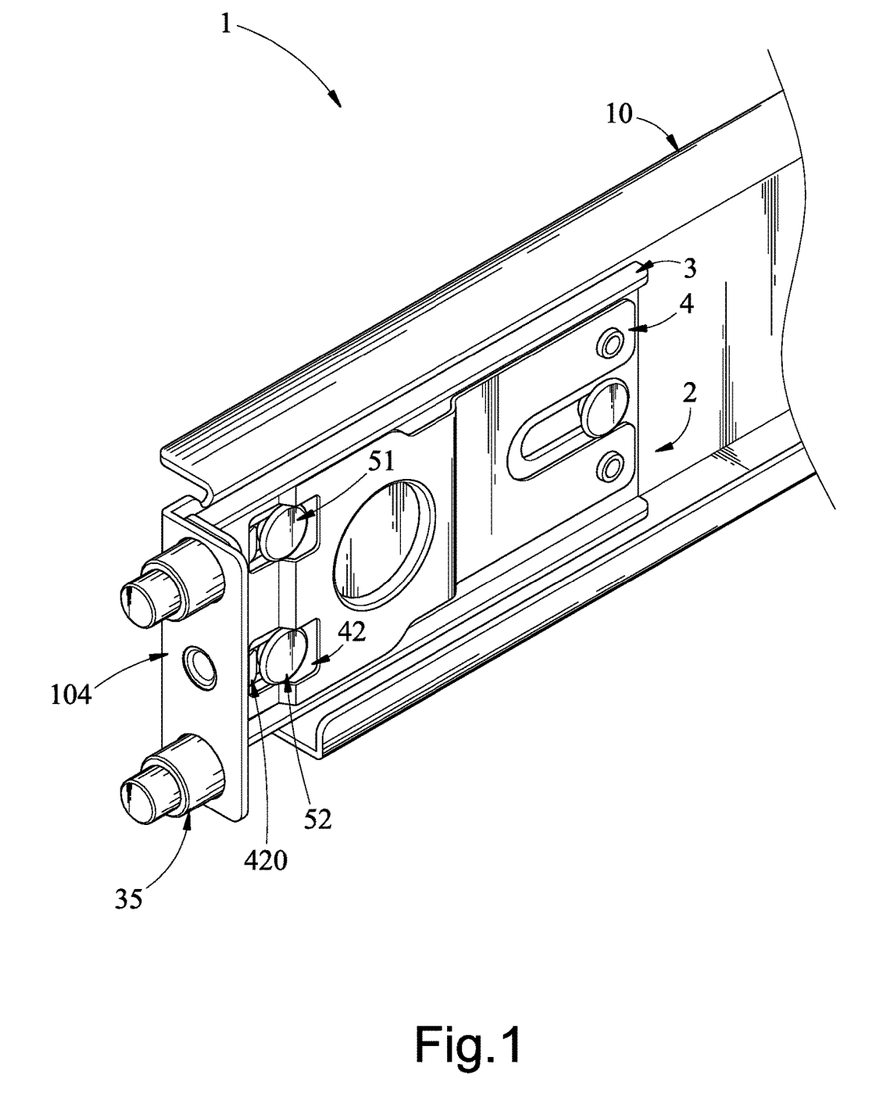
FIG. 1 is a perspective view to show the connection device of the present invention.
Figure 2:
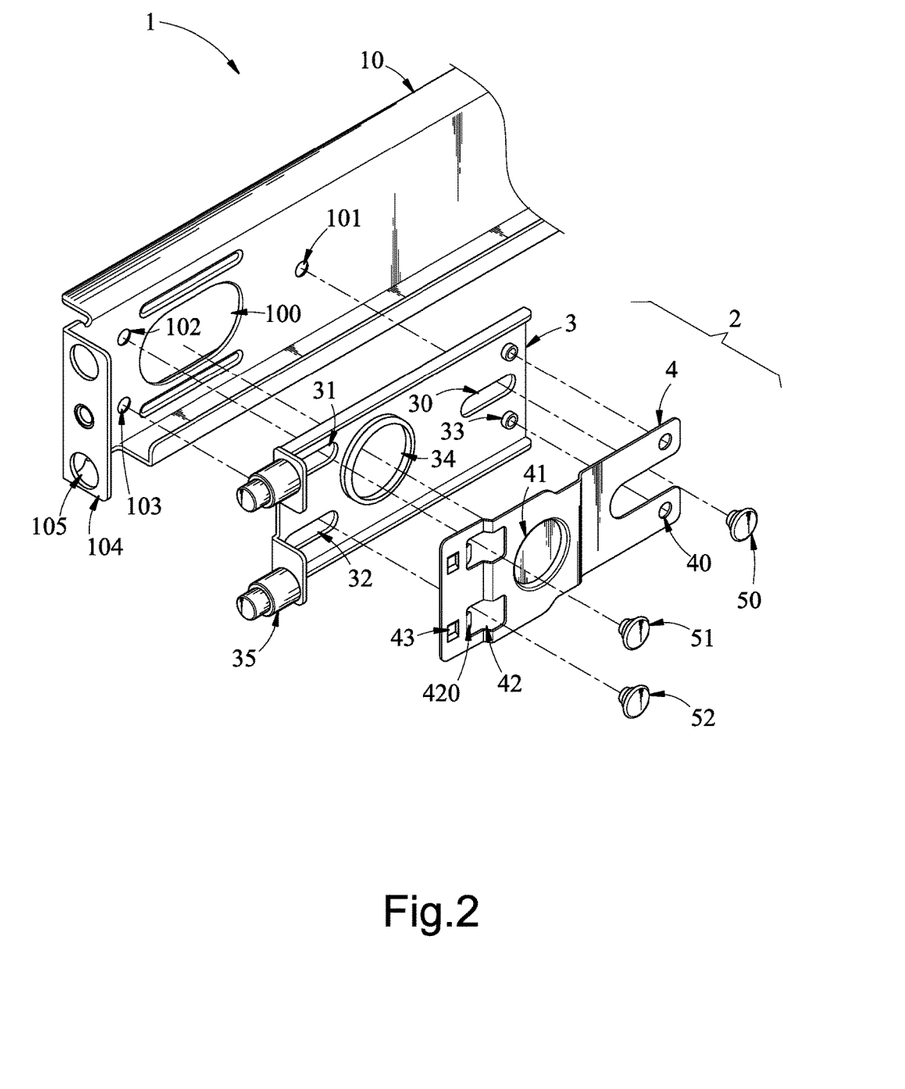
FIG. 2 is an exploded view of the connection device of the present invention.

The slidable unit 2 is slidably connected to one side of the rail 10 and includes a first member 3 and a second member 4. The first member 3 has a first slot 30, a second slot 31, a third slot 32 and a bore 34 defined therethrough. The bore 34 of the first member 3 is located corresponding to the opening 100 of the rail 10. The first slot 30 is defined in the first end of the first member 3. Two tubular members 33 extend from one side of the first end of the first member 3. Two guide pillars 35 extend from a bent portion on the second end of the first member 3 and are removably inserted into the through holes 105 of the bracket 104 of the rail 10.

Figure 3:
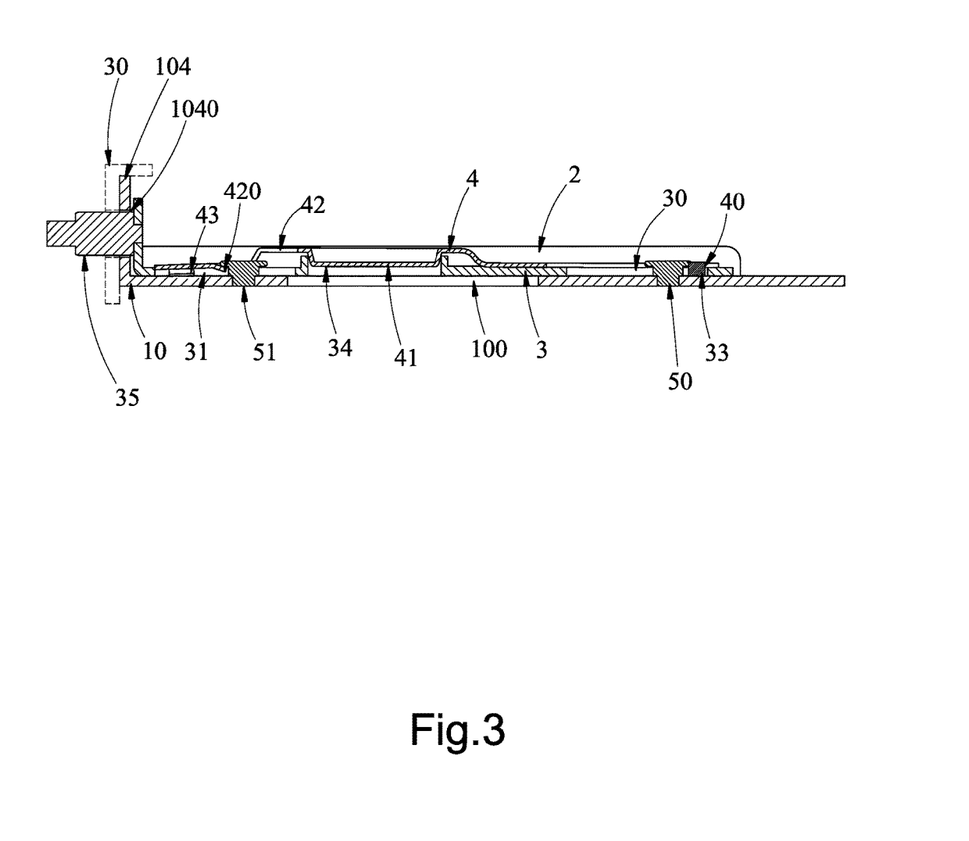
FIG. 3 is a side cross sectional view to show that the rail with the connection device of the present invention is connected to a rack post.

The second member 4 has two apertures 40, a pressing portion 41, two snapping holes 42 and two protrusions 43. The apertures 40 are defined in the first end thereof, and a U-shaped notch is defined through the first end of the second member 4 and located between the two apertures 40. The pressing portion 41 is a closed portion that protrudes from one side of the second member 4 and is inserted in the bore 34. The snapping holes 42 each are a rectangular hole and a tongue 420 extending from one inner end of each of the snapping holes 42 of the second member 4 inclinedly as shown in FIG. 3. The two protrusions 43 protrude from one side of the second member 4 and located close to the second end of the second member 4. The two protrusions 43 are respectively located at one end of the two snapping holes 42. A first rivet 50 extends through the notch located between the two apertures 40 of the second member 4, the first slot 30 of the first member 3, and is connected to the first positioning hole 101 of the rail 10. A second rivet 51 extends through one of the snapping holes 42 of the second member 4, the second slot 31 of the first member 3, and is connected to the second positioning hole 102 of the rail 10. A third rivet 52 extends through the other one of the snapping holes 42 of the second member 4, the third slot 32 of the first member 3, and is connected to the third positioning hole 103 of the rail 10. The two tubular members 33 of the first member 3 are engaged with the two apertures 40 of the second member 4. The second member 4 is flexible so that the second end of the second member 4 can be flexibly lifted away from the rail 10. Furthermore, the flexibility of the second member 4 provides a force to prevent the tongues 420 from being separated from the second and third rivets 51, 52 due to impact. As shown in FIG. 3, the protrusion 43 of the second member 4 protrude into the second and third slots 31, 32 when the second end of the second member 4 is not lifted away from the rail 10.

Figure 4:
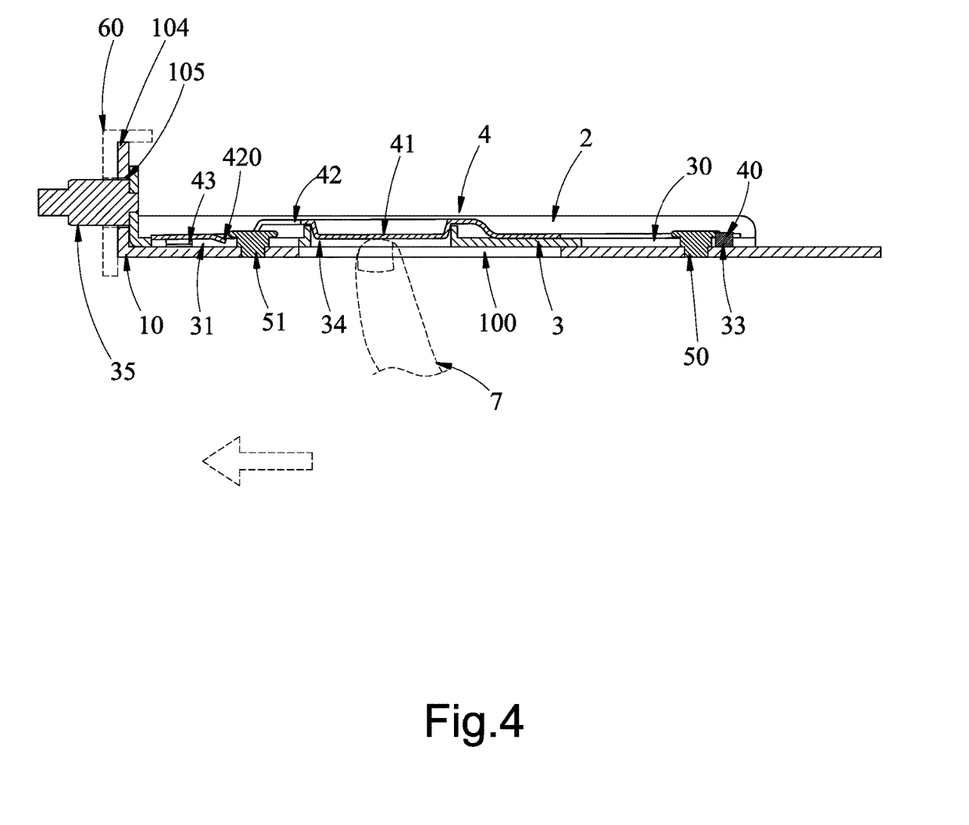
FIG. 4 is a side cross sectional view to show that a user's finger shifts the second member to remove the tongue from the rivet.
Figure 5:
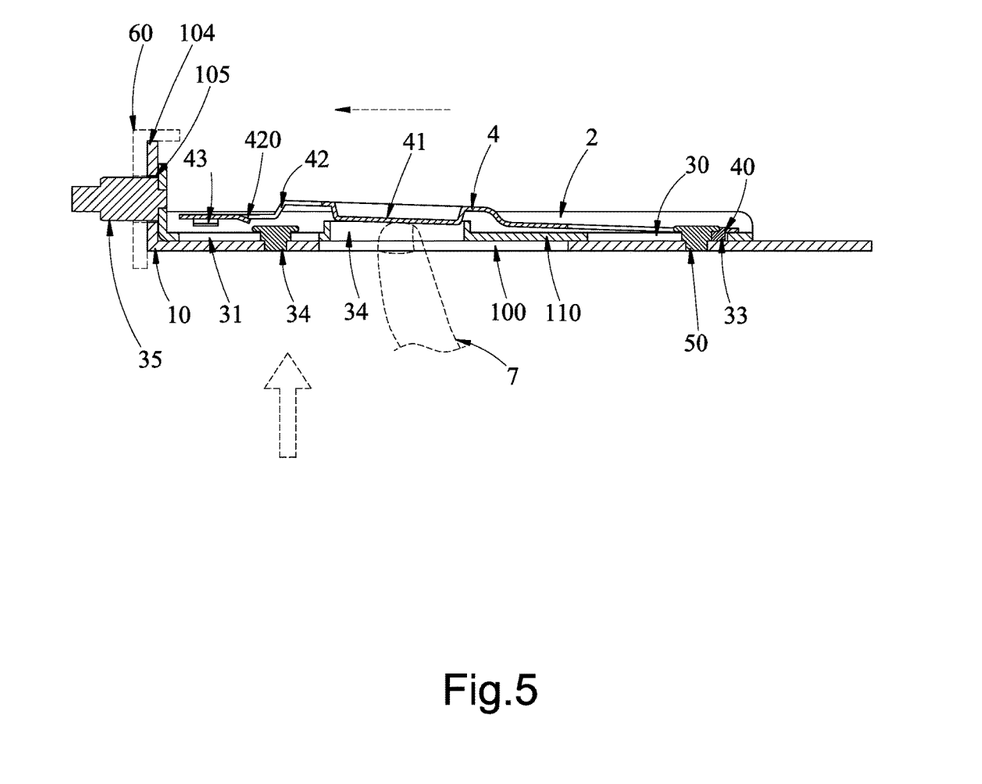
FIG. 5 is a side cross sectional view to show that the user's finger pushes the second member upward relative to the first member.
Figure 6:
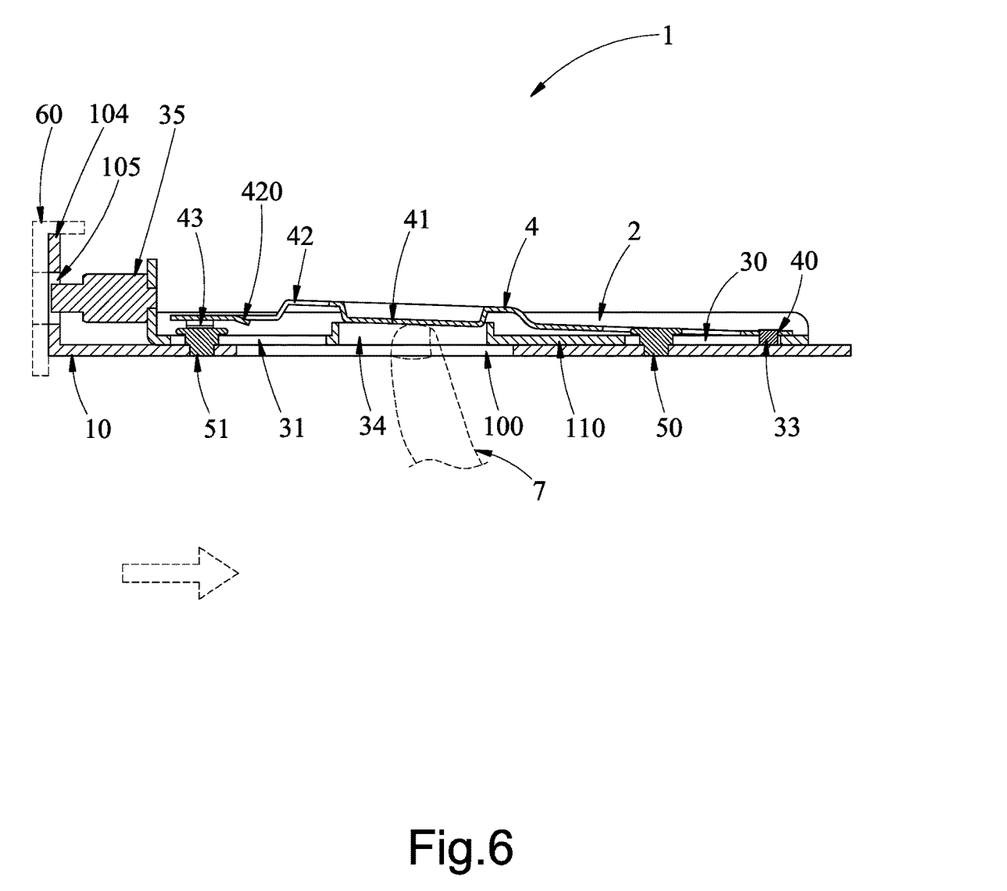
FIG. 6 is a side cross sectional view to show that the user's finger pulls the slidable unit and the rail away from the rack post.

As shown in FIG. 4, when removing the rail 2 from the rack post 60, the user's finger 7 inserts into the opening 100, and presses and shifts the pressing portion 41 toward the rack post 60, such that the first and second members 3, 4 are shifted, and the tongues 420 are moved away from the second and third rivets 51, 52. Then, the user's finger pushes the pressing portion 41 away from the rail 10. The second member 4 is flexible so that the second end of the second member 4 can be flexibly lifted away from the rail 10 as shown in FIG. 5. As shown in FIG. 6, the user's finger than pulls the pressing portion 41 away from the rack post 60, the first and second members 3, 4 are pulled away from the rack post 60, and the protrusions 43 of the second member 4 contact the two respective tops of the second and third rivets 51, 52, so that the second member 4 is kept on the bent status and does not bounce back. The guide pillars 35 are simultaneously removed from the through holes 105 of the bracket 104 of the rail 10 and the holes of the rack post 60, so that the rail 10 can be disengaged from the rack post 60.

When installing the rail 10 to the rack post 60, the above mentioned steps are proceeded in reverse sequence.

Figure 7:
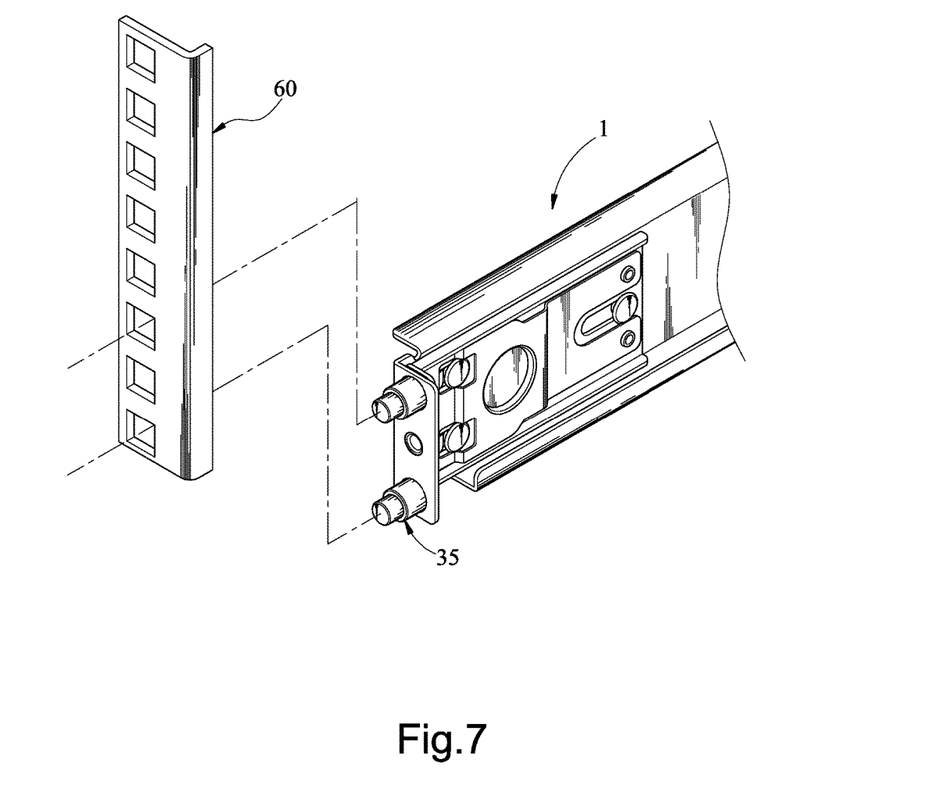
FIG. 7 shows that the rack post has rectangular holes.
Figure 8:
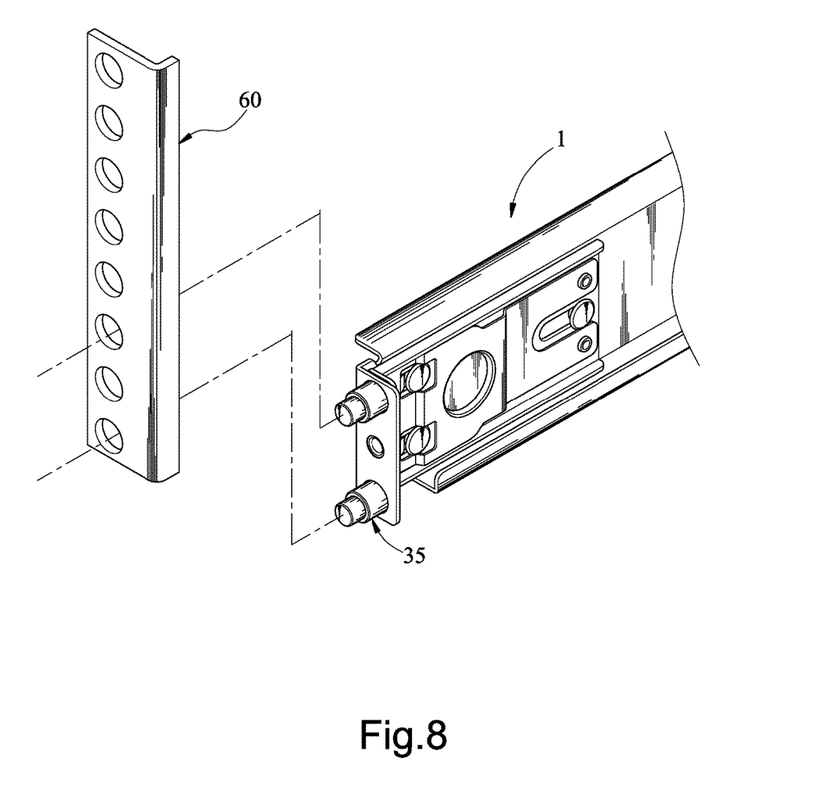
FIG. 8 shows that the rack post has round through holes.

FIGS. 7 and 8 respectively show that the rack post 60 has rectangular holes and round holes, such that the diameters of the guide pillars 35 are made to match such shapes.

While we have shown and described the embodiment in accordance with the present invention, it should be clear to those skilled in the art that further embodiments may be made without departing from the scope of the present invention.

What is claimed is:
1. A connection device for connecting a rail to a rack post, comprising:
a rail having an opening, a first positioning hole, a second positioning hole and a third positioning hole defined therethrough, a bracket being bent from one end of the rail and having multiple through holes;
a slidable unit slidably connected to one side of the rail and having a first member and a second member, the first member having a first slot, a second slot, a third slot and a bore defined therethrough, the first slot defined in a first end of the first member, two tubular members extending from one side of the first end of the first member, multiple guide pillars extending from a bent portion on a second end of the first member and removably inserted into the through holes of the bracket of the rail;
the second member having two apertures, a pressing portion, two snapping holes and two protrusions, the two apertures defined in a first end of the second member, the two protrusions protruding from one side of the second member and located close to a second end of the second member, a first rivet extending through a notch defined through the first end of the second member and located between the two apertures of the second member, the first slot of the first member, and connected to the first positioning hole of the rail, a second rivet extending through one of the snapping holes of the second member, the second slot of the first member, and connected to the second positioning hole of the rail, a third rivet extending through the other one of the snapping holes of the second member, the third slot of the first member, and connected to the third positioning hole of the rail, the two tubular members of the first member engaged with the two apertures of the second member, the second end of the second member being configured to be flexibly lifted away from the rail, and
the slidable unit being slidable along the notch, the snapping holes, the first, second and third slots relative to the first, second and third rivets.
2. The connection device as claimed in claim 1, wherein a tongue extending from one inner end of each of the snapping holes of the second member, the tongues removably contact the second and third rivets.
3. The connection device as claimed in claim 1, wherein the bore of the first member is located corresponding to the opening of the rail, the pressing portion is a closed portion that protrudes from one side of the second member and is inserted in the bore.
4. The as claimed in claim 1, wherein the protrusions of the second member protrude into the second and third slots when the second end of the second member is not lifted away from the rail, the protrusions of the second member contact two respective tops of the second and third rivets when the second end of the second member is lifted away from the rail and moves away from the bracket of the rail.

* * * * *